United States Patent
Ahn et al.

(10) Patent No.: US 7,863,515 B2
(45) Date of Patent: Jan. 4, 2011

(54) THIN-FILM SOLAR CELL AND METHOD OF MANUFACTURING THE SAME

(75) Inventors: Seh-Won Ahn, Seoul (KR); Young-Joo Eo, Seoul (KR); Kwy-Ro Lee, Seoul (KR); Don-Hee Lee, Seoul (KR); Heon-Min Lee, Seoul (KR)

(73) Assignee: LG Electronics Inc., Seoul (KR)

( * ) Notice: Subject to any disclaimer, the term of this patent is extended or adjusted under 35 U.S.C. 154(b) by 344 days.

(21) Appl. No.: 12/035,927

(22) Filed: Feb. 22, 2008

(65) Prior Publication Data

US 2008/0264478 A1    Oct. 30, 2008

(30) Foreign Application Priority Data

Feb. 26, 2007   (KR) .................. 10-2007-0019097

(51) Int. Cl.
*H01L 31/042* (2006.01)
*H01L 31/05* (2006.01)
*H01L 21/98* (2006.01)
*H01L 21/02* (2006.01)

(52) U.S. Cl. .................. 136/244; 136/251; 438/66; 438/67; 438/74; 438/80

(58) Field of Classification Search ......... 136/243–265; 438/57–98
See application file for complete search history.

(56) References Cited

U.S. PATENT DOCUMENTS

| 4,316,049 | A | * | 2/1982 | Hanak | 136/244 |
| 4,609,770 | A | * | 9/1986 | Nishiura et al. | 136/244 |
| 5,071,490 | A | * | 12/1991 | Yokota et al. | 136/249 |
| 2004/0200523 | A1 | * | 10/2004 | King et al. | 136/262 |
| 2005/0150542 | A1 | * | 7/2005 | Madan | 136/255 |

* cited by examiner

*Primary Examiner*—Basia Ridley
*Assistant Examiner*—Christina Chern
(74) *Attorney, Agent, or Firm*—Birch, Stewart, Kolasch & Birch, LLP

(57) ABSTRACT

A thin-film solar cell having a first solar cell layer with a plurality of unit cells including a photoelectric conversion layer that are connected in series; a second solar cell layer with a plurality of unit cells including a photoelectric conversion layer that are connected in series, and that has band gap energy different from the first solar cell layer and a threshold voltage coincident with the first solar cell layer; and an electrode connector, that connects the first solar cell layer with the second solar cell layer in parallel.

23 Claims, 12 Drawing Sheets

Laser Scribing

THIN-FILM SOLAR CELL AND METHOD OF MANUFACTURING THE SAME

CROSS-REFERENCE TO RELATED APPLICATIONS

This application claims the benefit of Korean Patent Application No. 10-2007-019097, filed on Feb. 26, 2007, in the Korean Intellectual Property Office, the disclosure of which is incorporated herein by reference.

BACKGROUND

1. Field of the Invention

The present invention relates to an integrated thin-film solar cell module and a method of manufacturing the same, and more particularly, to a thin-film solar cell and a method of manufacturing the same, which are capable of improving a photoelectric conversion efficiency.

2. Discussion of the Related Art

The research in solar cells as next generation clean energy resources has been carried out for many years. Until recently, as materials for solar cells, materials of group IV such as monocrystalline silicon, polycrystalline silicon, amorphous silicon, amorphous SiC, amorphous SiN, amorphous SiCe and amorphous SiSn, and compound semiconductors of group III-V such as gallium arsenide (GaAs), aluminum gallium arsenide (AlGaAs) and indium phosphorus (InP) or group II-VI such as CdS, CdTe and $Cu_2S$ have been used. Further, structures for the solar cell include a pn structure including back electrode layer; a pin structure; a heterojunction structure; a schottky structure; and a multiple junction structure including tandem or vertical junction type.

In general, as the characteristics required for the solar cell, there are a high photoelectric conversion efficiency, low production costs and a short energy recovery period.

A solar cell using monocrystalline bulk silicon, which is being commonly used at present, has a high photoelectric conversion efficiency, but the fact is that it is not being actively utilized due to high production and installation costs thereof. Research into thin-film solar cells has been actively carried out to solve such problems. Particularly, a thin-film solar cell using amorphous silicon (a-Si:H), which is capable of reducing production costs of large size solar cell modules and energy recovery period, has drawn more attention. However, the thin-film solar cell has problems such that the photoelectric conversion efficiency thereof is lower than that of a monocrystalline silicon solar cell and the efficiency is decreased when exposed to light.

For a solar cell using the other materials, in a case where the photoelectric conversion efficiency thereof is high, fabrication costs are increased and energy recovery period is extended, and in contrast, low fabrication costs and a short energy recovery period result in a low photoelectric conversion efficiency.

A structure including semiconductor layers having the different band gap energy and a buffer layer formed therebetween has been suggested to improve the above problems such as the low photoelectric conversion efficiency of the thin-film solar cell using amorphous silicon. Particularly, an up-down stack structure of amorphous silicon (a-Si:H) and microcrystalline silicon (uc-Si:H), which have the different band gap energy and crystal lattice mismatch, has been suggested.

FIG. 1 is a sectional view illustrating a stack structure of a thin-film solar cell module according to an example of the prior art.

In the thin-film solar cell module according to the example of the prior art shown in FIG. 1, a first solar cell layer 120 and a second solar cell layer 130 with the different characteristics and crystal structure consist of a stack structure and are electrically connected in series by connecting a transparent conductive layer 111 stacked on the unit cell of the second solar cell 130 with a transparent conductive layer 110 stacked under the adjacent unit cell of the first solar cell layer 120.

FIG. 2 is an equivalent circuit diagram of a diode illustrating a series connection of the semiconductor layers.

In general, a first solar cell layer toward incident sunlight consists of amorphous silicon and has a high band gap energy of about 1.7 to 1.9 eV, whereas, a second solar cell layer stacked onto the first solar cell layer consists of microcrystalline silicon and has a band gap energy of about 1.1 eV. Thus, since the solar cell layers having different absorption bands are stacked, the thin-film solar cell formed of both solar cell layers has a higher photoelectric conversion efficiency as compared with the thin-film solar cell formed of single solar cell layers. As a result of the research, a small module having an area of 3 $cm^2$ produces an initial photoelectric conversion efficiency of about 14.5% and a large area module produces an initial conversion efficiency of about 12%.

However, the solar cell structure on which the different double solar cell layers are stacked causes a problem such that the current of both the solar cell layers should be designed to be equal because both the solar cell layers are connected in series. By such a restriction, the thickness of an amorphous silicon intrinsic semiconductor layer of the first solar cell layer, which is located at the lower part, should be thickly formed beyond what is otherwise needed, and in proportion to the thickness, as the electric power rate generated at the amorphous solar cell layer become high, the total efficiency due to the Stabler-Wronski effect is excessively decreased. Conversely, in the case that the thickness of the intrinsic semiconductor layer is most suitable and thin, a short-circuit current of the first solar cell layer located at a lower part become small, and thus, as the difference of the short-circuit current between both the solar cell layers is increased, the total efficiency of the element in which two layers are connected in series is reduced compared with the total efficiency achieved by both solar cell layers because the whole short-circuit current is limited by the short-circuit current of the first solar cell layer.

In order to get over a difficulty of manufacturing process such that it is not easy to adjust the thickness of intrinsic semiconductor for producing an optimal photoelectric conversion efficiency at solar cells on which the different double solar cell layers are stacked, and in order to establish a stable reliability in a regular efficiency of manufactured solar cells, U.S. publication patent No. 2005/0150542 A1 discloses a solar cell module such that a first solar cell layer 220 and a second solar cell layer 230 are respectively connected to an adjacent cell in series, by separating the first solar cell layer 220 located toward the lower part from the second solar cell layer 230 located toward the upper part by a transparent insulating layer and providing a 4-T structure which draws two terminals from each solar cell layer.

FIG. 3 is a sectional view illustrating a stack structure of a 4-terminal thin-film solar cell module, which is disclosed in the above U.S. patent, and FIG. 4 is a diode equivalent circuit of the 4-terminal thin-film solar cell module.

SUMMARY OF THE INVENTION

The present invention has been suggested to solve the problems. It is an object of the present invention to provide a thin-film solar cell having a structure, which is capable of improving a photoelectric conversion efficiency and a method of manufacturing a thin-film solar cell, which is capable of reducing fabrication costs compared with the other thin-film silicon solar cells by manufacturing the solar cell through a relatively simple process.

It is another object of the present invention to provide a thin-film solar cell structure and a method of manufacturing the same, which are capable of minimizing the power loss by a mismatch in short-circuit currents, with respect to a solar cell having a structure in which two solar cell layers having great differences between short-circuit currents thereof and different characteristics are stacked.

It is yet another object of the present invention to provide a method of simply manufacturing a thin-film solar cell through a series of manufacturing processes, which is capable of improving a photoelectric conversion efficiency and solving complicated manufacturing processes of the prior art, with respect to a solar cell having a structure in which two solar cell layers having great differences between short-circuit currents thereof and different characteristics are stacked, in a way such that a first solar cell layer and a second solar cell layer are separately manufactured and connected.

In accordance with an aspect of the present invention, the above and other objects can be accomplished by the provision of a thin-film solar cell comprising: a first solar cell layer, in which a plurality of unit cells including photoelectric conversion layers are connected in series; a second solar cell layer, in which a plurality of unit cells including the photoelectric conversion layers are connected in series; and an electrode connector, which connects the first solar cell layer with the second solar cell layer.

In the present invention, the second solar cell layer has a band gap energy, which is different from the first solar cell layer, and a threshold voltage, which is coincident with the first solar cell layer.

The photoelectric conversion layers according to the present invention should not be construed as being limited to the above example embodiments and it will be apparent to those skilled in the art that modifications and variations can be made to the example embodiments of the present invention without deviating therefrom. Preferably, the photoelectric conversion layers is any one selected from a group consisting of amorphous silicon, microcrystalline silicon, monocrystalline silicon, polycrystalline silicon, amorphous Sic, amorphous SiN, amorphous SiGe, amorphous SiSn, gallium arsenide (GaAs), aluminum gallium arsenide (AlGaAs), indium phosphorus (InP), gallium phosphorus (GaP), copper indium gallium selenide (CIGS), cadmium telluride (CdTe), cadmium sulfide, copper sulfide ($Cu_2S$), zinc telluride (ZnTe), Plumbum sulfide (PbS), copper indium diselenide ($CuInSe_2$, CIS), gallium antimonide (GaSb) and compounds thereof.

In the present invention, the first solar cell layer and the second solar cell layer may be any one selected from an amorphous silicon solar cell layer and a microcrystalline silicon solar cell layer. Preferably, the amorphous silicon solar cell layer may be formed such that a p-i-n type amorphous silicon layer is consecutively stacked or a p-n type amorphous silicon layer is consecutively stacked.

Further, the microcrystalline silicon solar cell layer may be formed such that a p-i-n type microcrystalline silicon layer is consecutively stacked or a p-n type microcrystalline silicon layer is consecutively stacked.

A series connection of the unit cells according to the present invention may be provided with each transparent conductive layer at an upper part and a lower part of the unit cells and is characterized by connecting an upper transparent conductive layer of the unit cells with a lower transparent conductive layer of adjacent unit cells.

A thin-film solar cell comprises at least one or more electrode connector.

Preferably, a electrode connector consists of a lower electrode connector, which connects the lower transparent conductive layer of each unit cell of the first solar cell layer with the lower transparent conductive layer of each unit cell of the second solar cell layer, and an upper electrode connector, which connects the upper transparent conductive layer of each unit cell of the first solar cell layer with the upper transparent conductive layer of each unit cell of the second solar cell layer.

The first solar cell layer and the second solar cell layer are provided with each transparent conductive layer at the upper part and lower part of the unit cells thereof, and are connected in series by connecting the upper transparent conductive layer of each unit cell with the lower transparent conductive layer of an adjacent unit cell.

Preferably, the first solar cell layer and the second solar cell layer connected by the upper and lower electrode connectors have the same width as each other.

In other words, the number of unit cells of the first solar cell layer and the second solar cell layer which are included between at least a couple of the upper electrode connector and lower electrode connector, can be adjusted so that the first solar cell layer and the second solar cell layer have the same width as each other.

When the thin-film solar cell of the present invention is manufactured, each number of the unit cells is previously calculated so that a threshold voltage of the first solar cell layer and the second solar cell layer is the same as each other, thereby determining the patterning of the unit cells of the solar cell.

In the present invention, stack shapes or arrangements of the first solar cell layer and the second solar cell layer should be not construed as being limited to example embodiments set forth herein, as well as they could be easily achieved by those skilled in the art, and preferably, the first solar cell layer and the second solar cell layer may be vertically stacked with an insulating layer therebetween.

To achieve the above-mentioned objects, a method of manufacturing a thin-film solar cell of the present invention comprises the steps of: forming a first solar cell layer by forming a plurality of unit cells including a photoelectric conversion layer and connecting them in series; forming a second solar cell layer by forming a plurality of unit cells including a photoelectric conversion layer and connecting them in series; and electrically connecting the first solar cell layer with the second solar cell layer in parallel.

In the present invention, the second solar cell layer may have a band gap energy, which is different from the first solar cell layer, and a threshold voltage, which is coincident with the first solar cell layer.

Preferably, the thin-film solar cell of the present invention further comprises the step of forming transparent conductive layers at the upper part and lower part of the unit cells, respectively.

Further, the unit cells may be patterned by any one selected from a laser scribing method, an optical scribing method, a mechanical scribing method, an etching method using plasma, a wet-type etching method, a dry-type etching method, a lift-off method and a wire mask method.

Preferably, the method of manufacturing the thin-film solar cell of the present invention further comprises the step of forming an insulating layer between the first solar cell layer and the second solar cell layer.

A series connection of the unit cells according to the present invention may be provided with each transparent conductive layer at an upper part and a lower part of the unit cells and is characterized by connecting an upper transparent conductive layer of the unit cells with a lower transparent conductive layer of adjacent unit cells.

Preferably, an electrode connector is provided with each transparent conductive layer at the upper part lower part of the unit cells of the first solar cell layer and the second solar cell layer, which are formed by connecting the upper transparent conductive layer of unit cells with the lower transparent conductive layer of an adjacent unit cell in series comprising at least one or more electrode connector, which consists of a lower electrode connector, which connects the lower transparent conductive layer of each unit cell of the first solar cell layer with the lower transparent conductive layer of each unit cell of the second solar cell layer; and an upper electrode connector, which connects the upper transparent conductive layer of each unit cell of the first solar cell layer with the upper transparent conductive layer of each unit cell of the second solar cell layer.

Preferably, the first solar cell layer and the second solar cell layer, which are connected by the upper and lower electrode connector, have the same width as each other.

The first solar cell layer and the second solar cell layer according to manufacturing methods of the present invention may be vertically stacked with an insulating layer therebetween, but it should not be construed as being limited to this embodiment and may be embodied in many different forms.

Further, the first solar cell layer may be formed by consecutively stacking a p-i-n type amorphous silicon layer or a p-n type amorphous silicon layer and the second solar cell layer may be formed by consecutively stacking a p-i-n type microcrystalline silicon layer or a p-n type microcrystalline silicon layer A method of manufacturing a thin-film solar cell according to the present invention comprises the steps of: stacking and patterning a lower transparent conductive layer of a first solar cell layer on a substrate; stacking and patterning an amorphous silicon p-i-n layer or amorphous silicon p-n layer on a lower transparent conductive layer of the first solar cell layer; forming an upper transparent conductive layer of the first solar cell layer on the amorphous silicon layer and connecting it with the lower transparent conductive layer; forming at least one or more unit cell of the first solar cell layer by patterning the upper transparent conductive layer; forming an insulating layer on unit cells of the first solar cell layer; stacking and patterning the lower transparent conductive layer of a second solar cell layer on the insulating layer; connecting the lower transparent conductive layer of the first solar cell layer with the lower transparent conductive layer of the second solar cell layer through a lower electrode connector; stacking and patterning a microcrystalline silicon p-i-n layer or a microcrystalline silicon p-n layer on the lower transparent conductive layer of the second solar cell layer; forming at least one or more unit cell of the second solar cell layer by further forming the upper transparent conductive layer of the second solar cell layer on the microcrystalline silicon layer and connecting it with the lower transparent conductive layer of the second solar cell layer; and further forming a back-side electrode layer on the upper transparent conductive layer of the second solar cell layer and connecting the back-side electrode layer or the upper transparent conductive layer of the second solar cell layer with the upper transparent conductive layer of the first solar cell layer by the upper electrode connector.

The lower electrode connector and upper electrode connector are formed at a distance so that the first solar cell layer and the second solar cell layer have the same width as each other.

The lower electrode connector and the upper electrode connector form a pair of electrode connectors and at least one or more electrode connector may be formed at a large area thin-film solar cell.

BRIEF DESCRIPTION OF THE DRAWINGS

These and other objects, features, and advantages of preferred embodiments of the present invention will be more fully described in the following detailed description, taken in conjunction with the accompanying drawings. In the drawings.

DETAILED DESCRIPTION OF PREFERRED EMBODIMENTS

Figure 1:
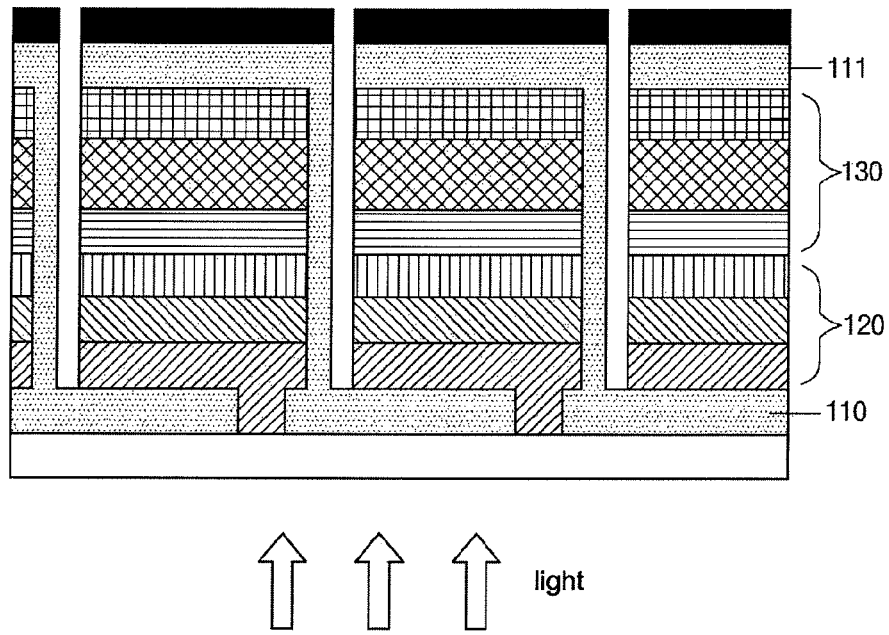
FIG. 1 is a sectional view illustrating a stack structure of a thinfilm solar cell module according to an example of the prior art.
Figure 2:
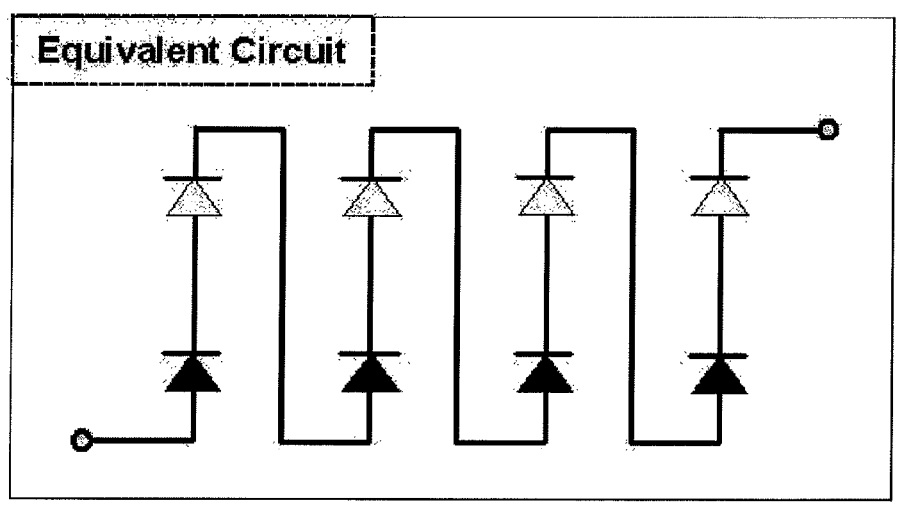
FIG. 2 is a diode equivalent circuit diagram of the thin film solar cell module according to the example of the prior art.

Embodiments of the present invention will now be described hereafter with reference to the attached drawings. Reference numerals added to construction elements of each drawings use the same numerals within the range of the same construction elements, even though they are indicated in the other drawings, and the detailed description about well-known functions and structures, which are outside the subject matter of the present invention will be omitted.

Figure 5:
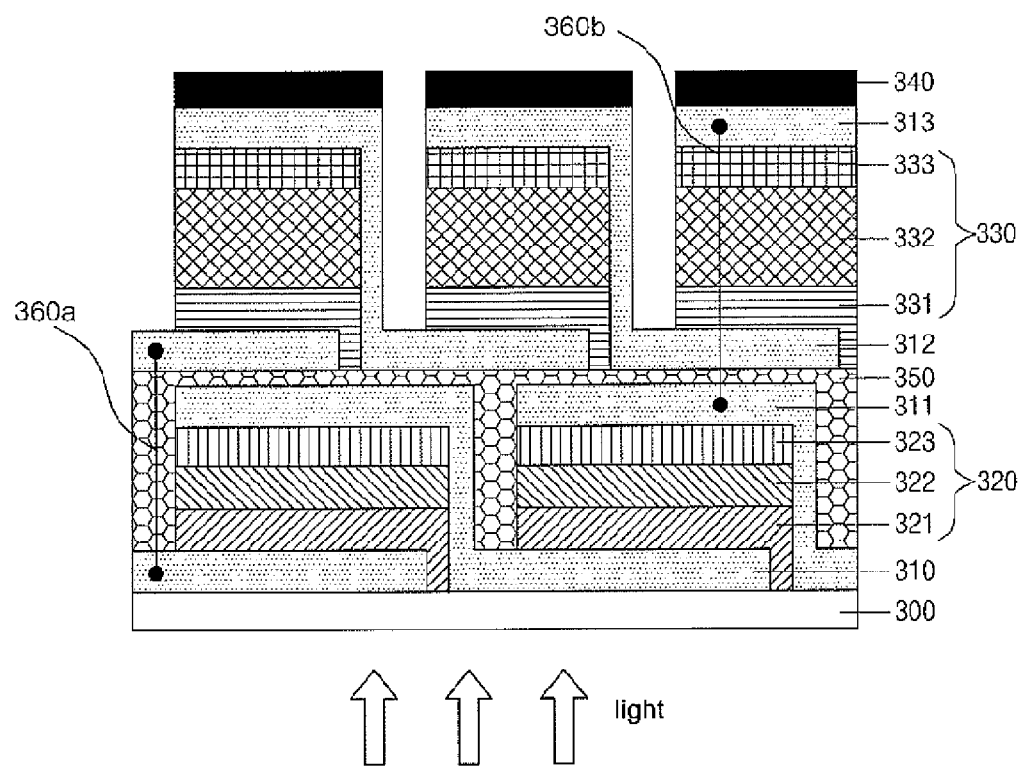
FIG. 5 is a sectional view illustrating a stack structure of the thin-film solar cell module according to a preferred embodiment of the present invention.
Figure 6:
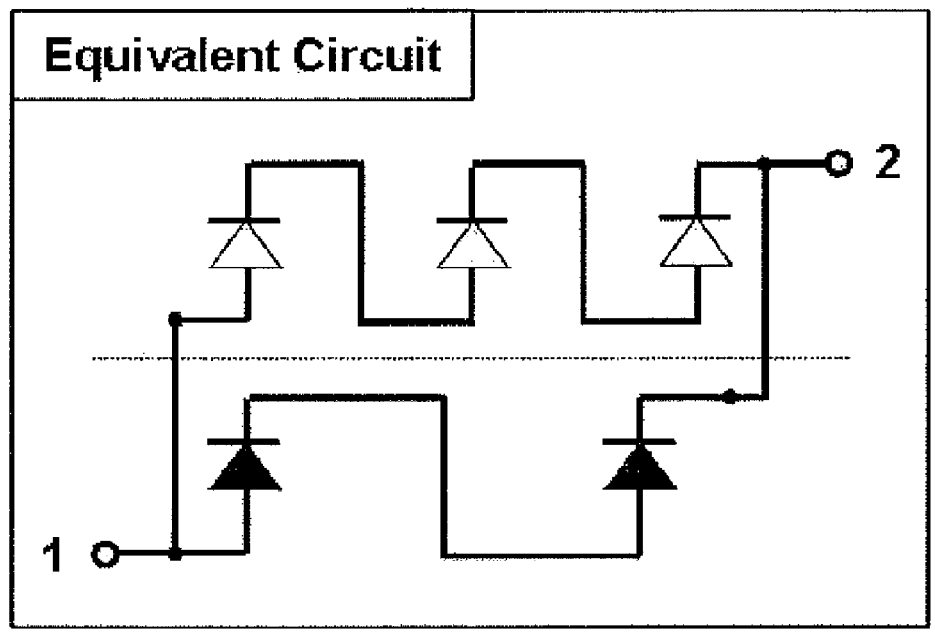
FIG. 6 is a diode equivalent circuit of the thin-film solar cell module according to the preferred embodiment of the present invention.

FIG. 5 is a sectional view illustrating a stack structure of the thin-film solar cell module according to the preferred embodiment of the present invention and FIG. 6 is a diode equivalent circuit of the thin-film solar cell module according to the preferred embodiment of the present invention.

In the preferred embodiment of the present invention, the thin-film solar cell is formed by stacking a substrate 300, the first solar cell layer 320, the second solar cell layer 330 and the back-side electrode layer 340; transparent conductive layers 310 and 311 are provided at the lower part and upper part of the first solar cell layer 320, respectively and transparent conductive layers 312 and 313 are provided at the lower part and upper part of the second solar cell layer 330, respectively; and the first solar cell layer 320 and the second solar cell layer 330 are electrically separated from each other by an insulating layer 350 therebetween. Further, the example embodiment has a structure that the first solar cell layer 320 and the second solar cell layer 330 may be stacked up and down and provided with the insulating layer therebetween, but is not limited to this structure, thereby there is not any limitation for arrangement shapes of both the solar cell layers.

Electrically connecting the first solar cell layer 320 with the second solar cell layer 330 in parallel may be carried out by an electrode connector 360a for connecting the lower transparent conductive layer 310 of first solar cell layer 320 and the lower transparent conductive layer 312 of the second solar cell layer 330 and an electrode connector 360b for connecting the upper transparent conductive layer 311 of first solar cell layer 320 and the upper transparent conductive layer 313 of the second solar cell layer 330.

The upper electrode connector 360b of both the solar cell layers may be connected to a backside electrode layer 340 which is provided at the upper part of the second solar cell layer 330.

Referring to FIG. 5, the thin-film solar cell layer according to the preferred embodiment of the present invention consists of a multiple junction structure of a plurality of unit cells separated by patterning and these unit cells are electrically connected in series by the transparent conductive layer formed at the upper part and the lower part of each solar cell layer. A plurality of the unit cells are electrically connected in series, thereby forming an integrated large area thin-film solar cell.

The series connection between the unit cells is achieved through an insulating layer 350 formed between adjacent unit cells.

In the above example embodiment, the thin-film solar cell has gaps formed between unit cells by patterning from the top and isolation processes, consecutively, to a back-side electrode layer 340, the upper transparent conductive layer 313 and p layer 331 of the second solar cell layer 330, and an air in the gaps can be performed as an insulating layer and adjacent unit cells are electrically connected in series.

Two solar cell layers consisting of the unit cells, which are connected in series, namely, the first solar cell layer 320 and the second solar cell layer 330 are connected in parallel by the electrode connectors 360a, 360b.

Semiconductor materials that form the first solar cell layer 320 and the second solar cell layer 330 may be formed of materials, which are different from each other having different characteristics. Namely, they may consist of semiconductor materials having different band gap energy.

The thin-film solar cell according to the preferred embodiment of the present invention may be formed of amorphous silicon and microcrystalline silicon. Particularly, the first solar cell layer 320 stacked on a glass substrate 300 may be made of amorphous silicon and the second solar cell layer 330 also may be made of microcrystalline silicon. In case of this embodiment, a band gap energy of the amorphous silicon semiconductor layer is 1.7 eV to 1.9 eV and a band gap energy of the microcrystalline silicon semiconductor layer is 1.1 eV.

However, these examples are provided only for illustrating the present invention and should not be construed as limiting the scope of the present invention. Thus, any one among general semiconductor materials such as amorphous silicon, microcrystalline silicon, monocrystalline silicon, polycrystalline silicon, amorphous SiC, amorphous SiN, amorphous Sie, amorphous SiSn, gallium arsenide (GaAs), aluminum gallium arsenide (AlGaAs), indium phosphorus (InP), gallium phosphorus (GaP), copper indium gallium selenide (CIGS), cadmium telluride (CdTe), cadmium sulfide, copper sulfide ($Cu_2S$), zinc telluride (ZnTe), Plumbum sulfide (PbS), copper indium diselenide ($CuInSe_2$; CIS), gallium antimonide (GaSb) and compounds thereof may be selected.

One solar cell layer may be formed by stacking a semiconductor layer having p-i-n or p-n type junction structure.

Preferably, the first solar cell layer 320 stacked on a glass substrate 300 may be formed by stacking a p-type semiconductor layer 321, an i-type semiconductor layer 322, and a n-type semiconductor layer 323.

Also, the second solar cell layer 330 may be formed by stacking a p-type semiconductor layer 331, an i-type semiconductor layer 332, and a n type semiconductor layer 333.

A threshold voltage of unit cell that forms both the solar cell layers is different from each other because the semiconductor materials that form the first solar cell layer and the second solar cell layer are formed of the materials, which are different from each other having the different band gap characteristics.

In the present invention, when the length that both the solar cell layers are connected in parallel by the electrode connector become one solar cell unit module, it should be configured so that threshold voltages of each solar cell layer within the unit module are nearly coincident with each other. Since the difference between the short-circuit currents is increased and the total efficiency of the solar cell module is reduced by the different band gap energy of semiconductor materials that form each solar cell layer, it is necessary that the threshold voltages of each solar cell layer within the unit module are nearly coincident with each other.

For this, the number of unit cell that forms each solar cell layer is adjusted and patterned accordingly.

As one embodiment, in a case where a threshold voltage of semiconductor material of the first solar cell layer is 0.70V and that of the second solar cell layer is 0.47V, the number of unit cells of the first solar cell layer provided within a unit module, which is connected in parallel by a pair of electrode connectors, is 2 unit cells and the number of unit cells of the second solar cell layer becomes 3 unit cells.

In this case, at one unit module, since the total threshold voltage that forms two unit cells of the first solar cell layer is 1.40V and the total threshold voltage that forms the three unit cells of the second solar cell layer is 1.41V, the threshold voltages of both the solar cell layers are nearly coincident with each other. Thus, the photoelectric conversion efficiency is not reduced by the difference of the threshold voltage, thereby obtaining the solar cell module having a high efficiency.

In the above example embodiment, it is preferable that the first solar cell layer and the second solar cell layer within the unit module formed by a couple of electrode connectors have the same width as each other, and thus, the width of the unit cells of the first solar cell layer and the second solar cell layer become different from each other so that the number of the unit cells of the first solar cell layer and the second solar cell layer are provided to be within the same width for obtaining the threshold voltages, which are nearly coincident with each other, and thus patterned accordingly.

Referring to FIG. 5, since the number of unit cells of the first solar cell layer provided at the width between the identical unit module is 2 unit cells and the number of the unit cells of the second solar cell layer is 3 unit cells, the width of unit cells of the first solar cell layer is greater than that of the second solar cell layer.

Figure 3:
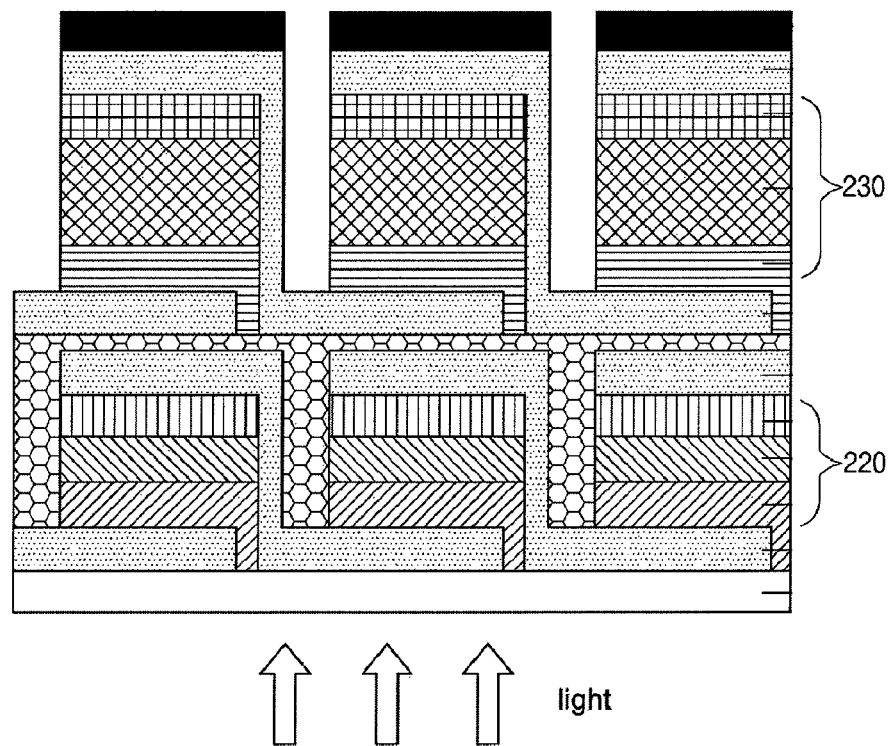
FIG. 3 is a sectional view illustrating a stack structure of a 4-terminal thin-film solar cell module according to another example of the prior art.
Figure 4:
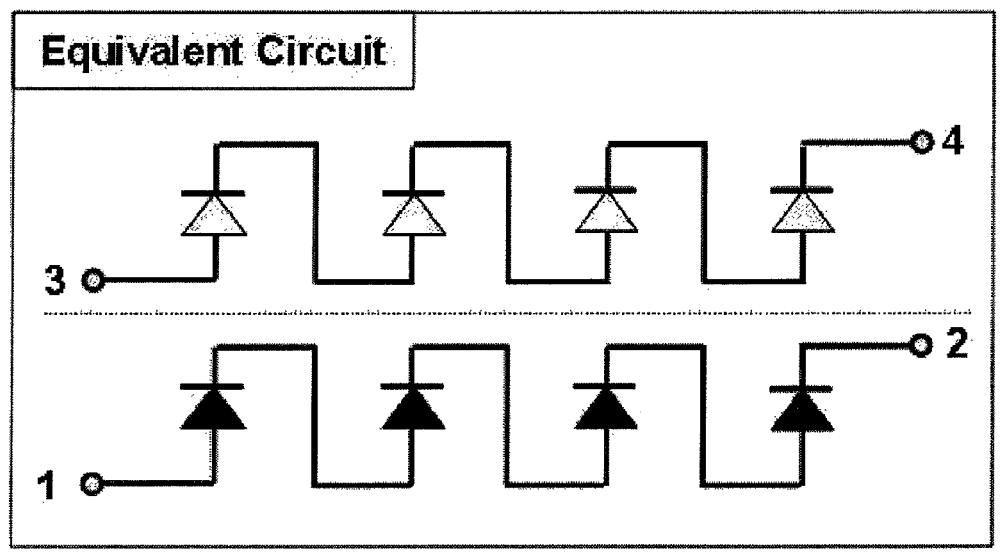
FIG. 4 is a diode equivalent circuit of a 4-terminal thin-film solar cell module according to the example of the prior art.

Referring to FIG. 6, which is an equivalent circuit diagram of the solar cell according to the above embodiment, the first solar cell layer and the second solar cell layer have the unit cells of the different numbers so that the threshold voltages are respectively matched with each other, and are connected in parallel, thereby obtaining 2 terminals as a general solar cell, which is different from obtaining 4 terminals as a result that the conventional 4-T type thin-film solar cell as shown in FIGS. 3 and 4 has insulating layers between both the solar cell layers stacked at the upper part and lower part so as to be electrically separated.

Accordingly, output voltages of the solar cell layers of the upper and lower parts may be efficiently combined and, obtaining 2 terminals can lead to high economic effectiveness in respect to the fabrication processes or costs.

The number of unit cells of each layers is calculated so that the threshold voltages of the first solar cell layer and the second solar cell layer formed of semiconductor materials having different characteristics are matched, and the width of the unit cell for the number of unit cells included within the unit module having a predetermined width is calculated, thereby achieving an integrated large area thin-film solar cell.

The process of inducing a photovoltaic effect from the element of the thin-film solar cell is started while light incident through the glass substrate penetrates a p type silicon layer of the first solar cell layer or the second solar cell layer and is then absorbed into an i type silicon layer.

In a case where the energy of the above incident light is larger than that of an optical band gap of amorphous silicon or microcrystalline silicon, an electron is excited and an electron-hole pair is generated. The generated electron and hole are separated into n type silicon layer and p type silicon layer, by an internal field, respectively, and moved, thus, when a photovoltaic power generated between the pole tip of the p type and n type layers is connected to the outside circuit, the solar cell is operated.

Referring to the equivalent circuit diagram of FIG. 6, a photovoltaic power is induced at the first solar cell layer 320 located at the lower part and the second solar cell layer 330 located at the upper part. A unit module connected in parallel is formed by connecting the solar cell layers 320 and 330 by electrode connectors 360a, 360b and is connected to the outside circuit to operate the solar cell.

The above embodiment can lead to effects such as simple manufacture methods and reduced fabrication costs because the number of unit cells is adjusted so that the threshold voltage is matched while a stack structure of the solar cell layers having two different characteristics is kept, and a structure between layers is adjusted through patterning using stack orders and isolation process within a range of manufacture methods of the conventional solar cell so that each solar cell layer is electrically connected in parallel. Hereinafter, the detailed manufacture method will be described.

Figure 7:
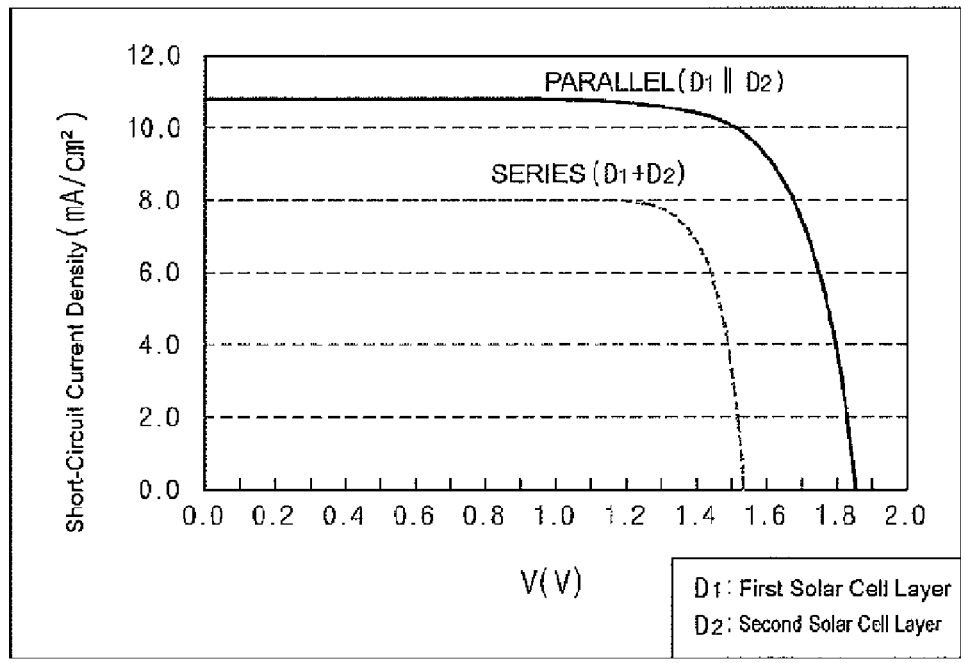
FIG. 7 is a graph illustrating the relationship between short-circuit current density-voltage for the thin-film solar cell module according to the preferred embodiment of the present invention and the thin-film solar cell module according to an example embodiment of the prior art.
Figure 8:
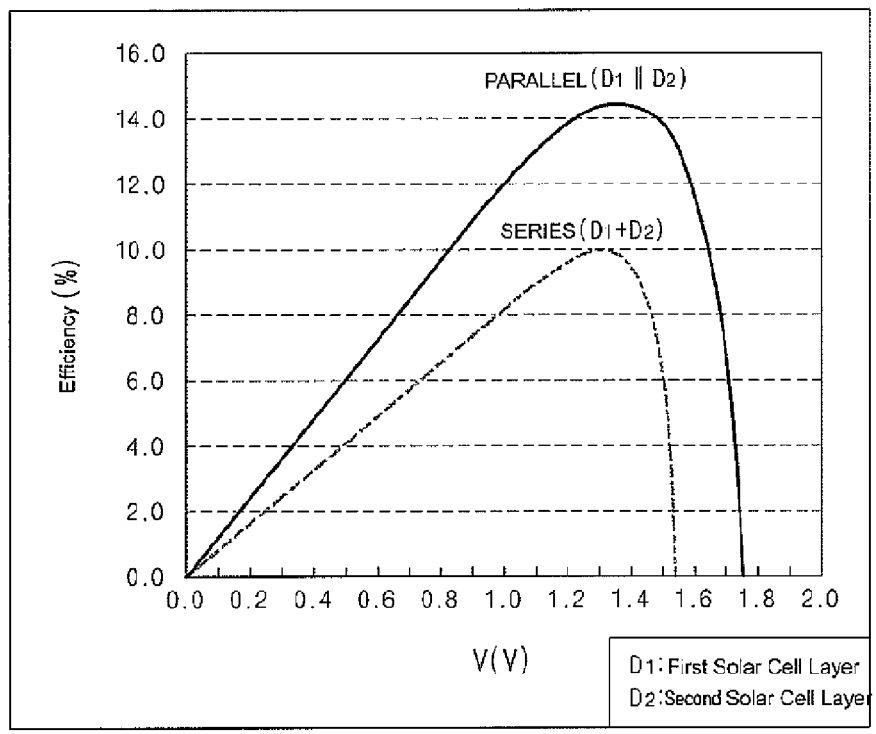
FIG. 8 is a graph illustrating the relationship between the efficiency-voltage for the thin-film solar cell module according to the preferred embodiment of the present invention and the thin-film solar cell module according to an example embodiment of the prior art.
Figure 9:
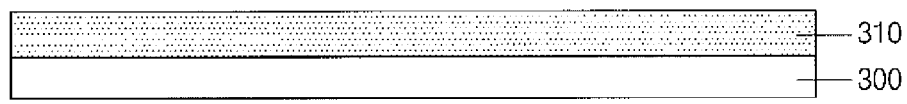
FIG. 9 to FIG. 24 are sectional views illustrating a stack structure of modules representing a method of manufacturing the thin-film solar cell in response to process steps according to the preferred embodiment of the present invention.
Figure 10:
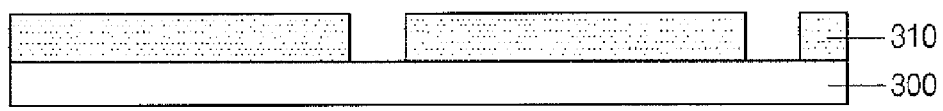
Figure 11:
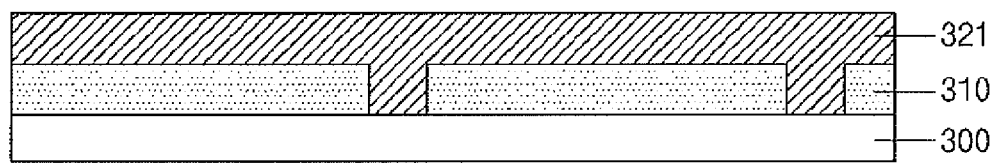
Figure 12:
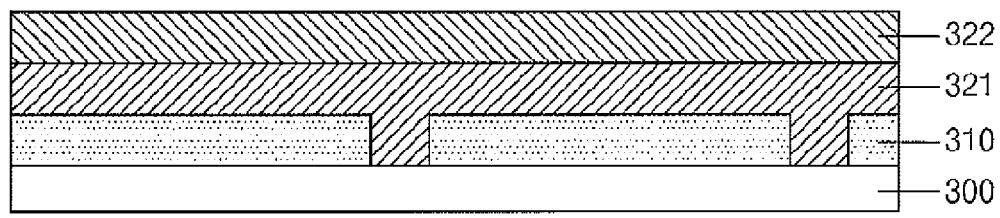
Figure 13:
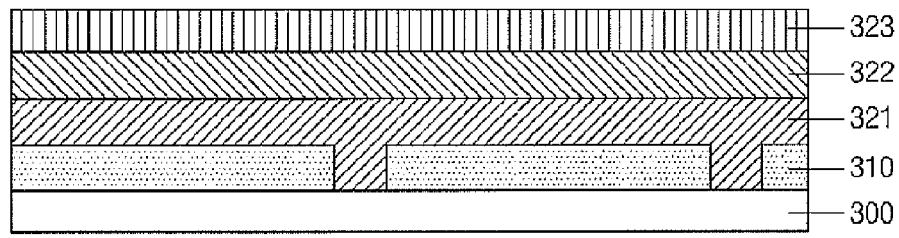
Figure 14:
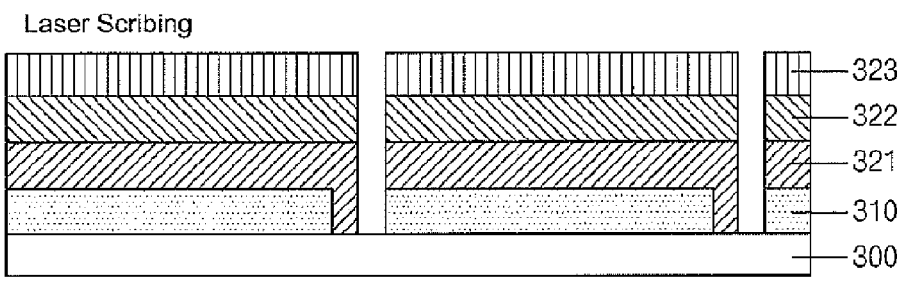
Figure 15:
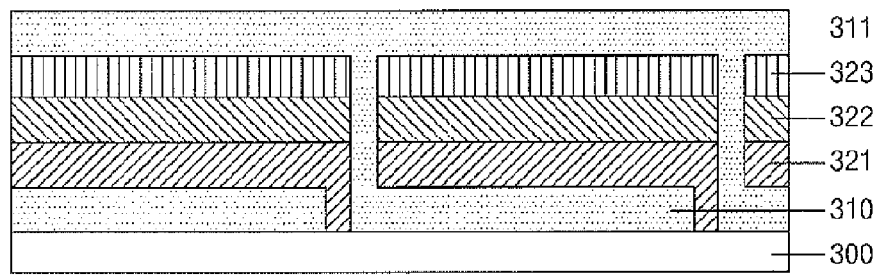
Figure 16:
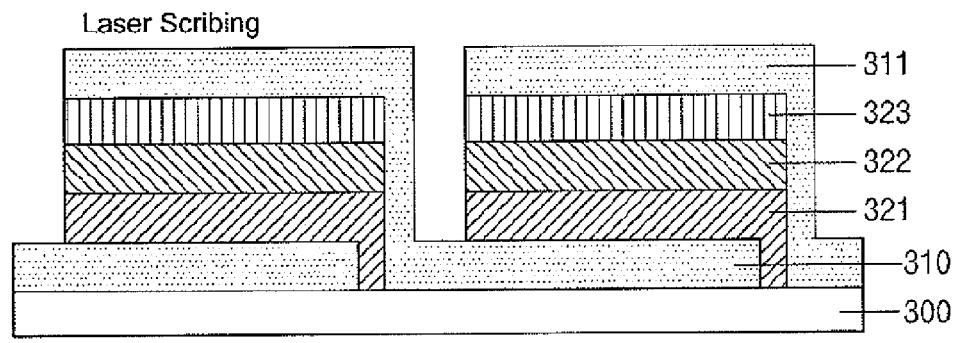
Figure 17:
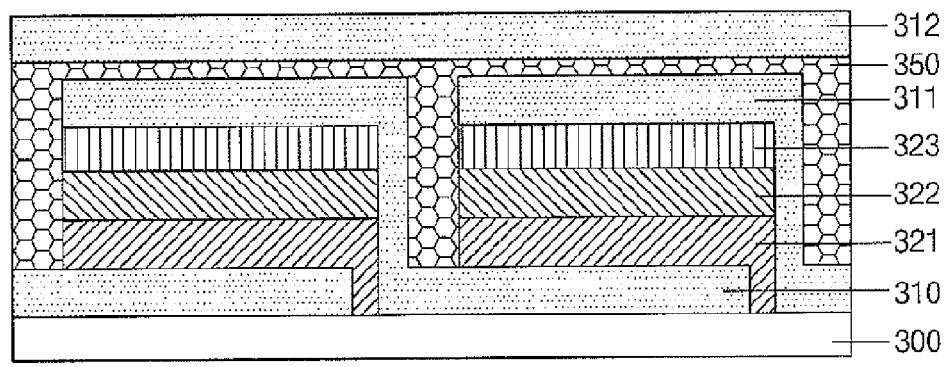
Figure 18:
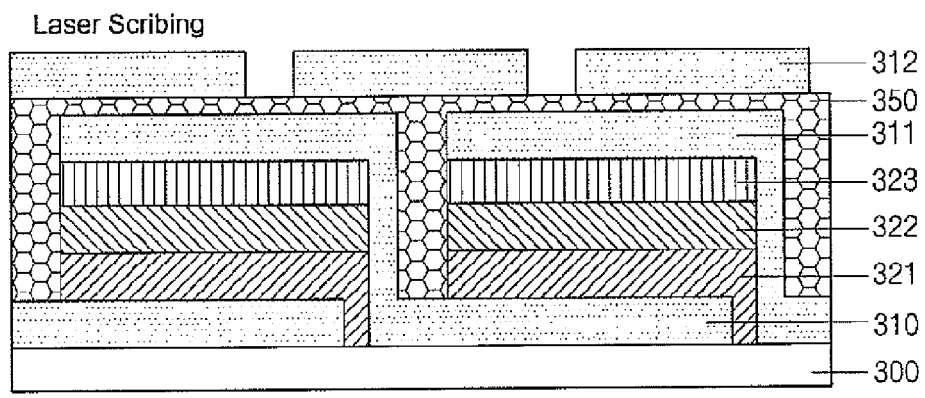
Figure 19:
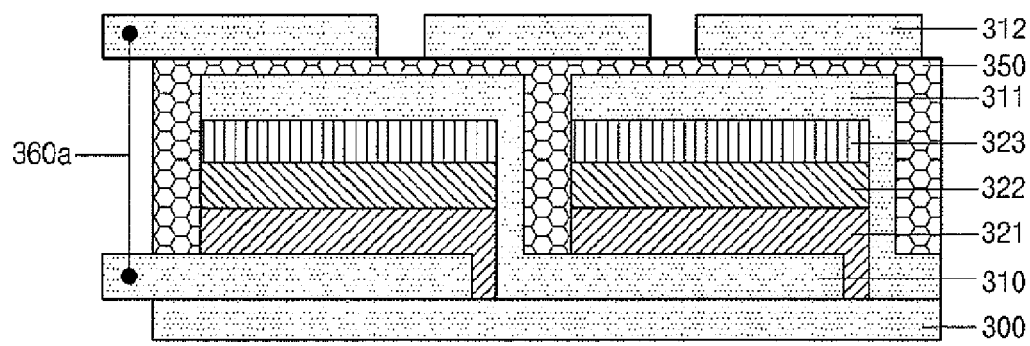
Figure 20:
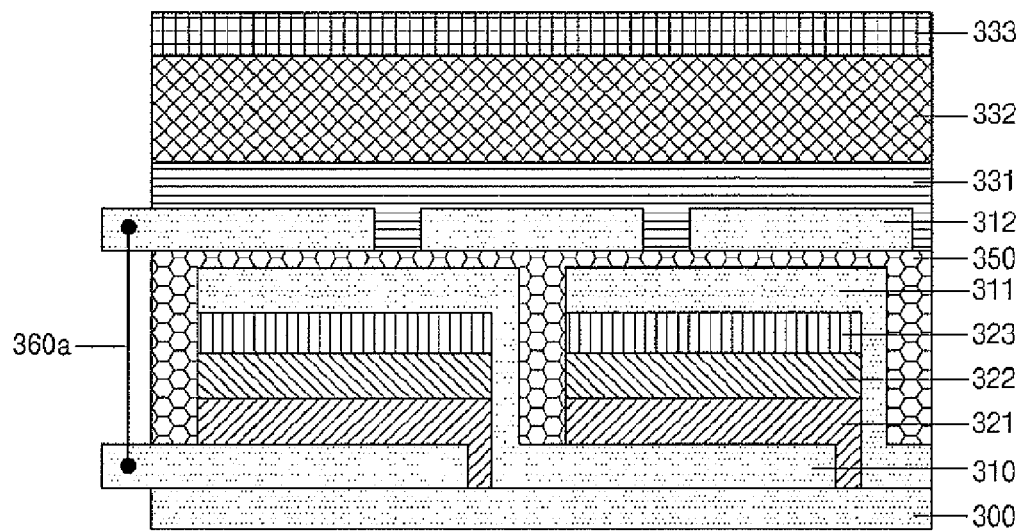
Figure 21:
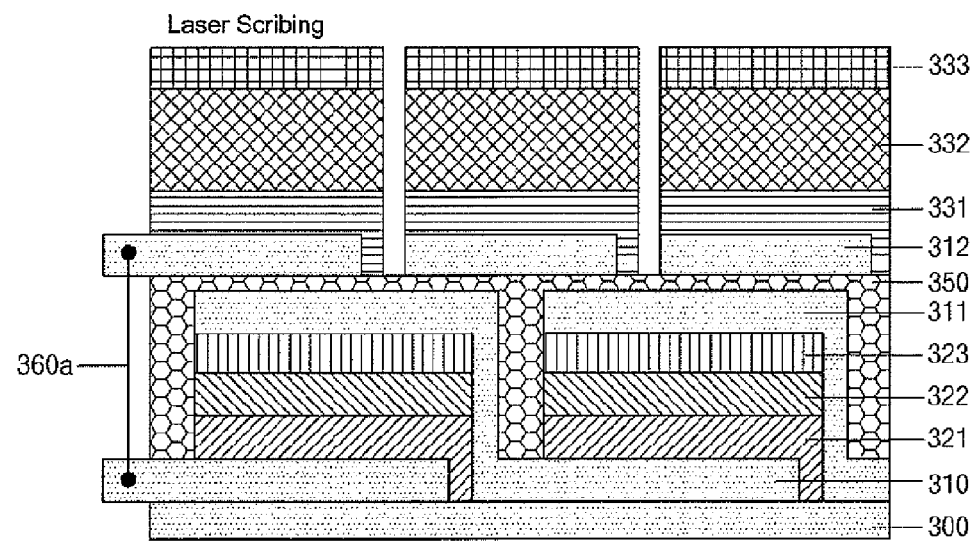
Figure 22:
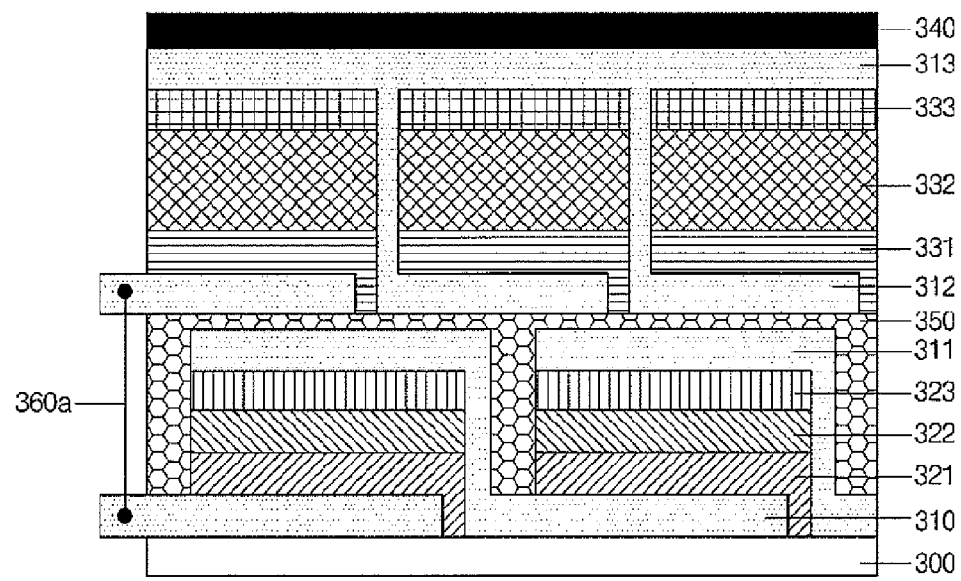
Figure 23:
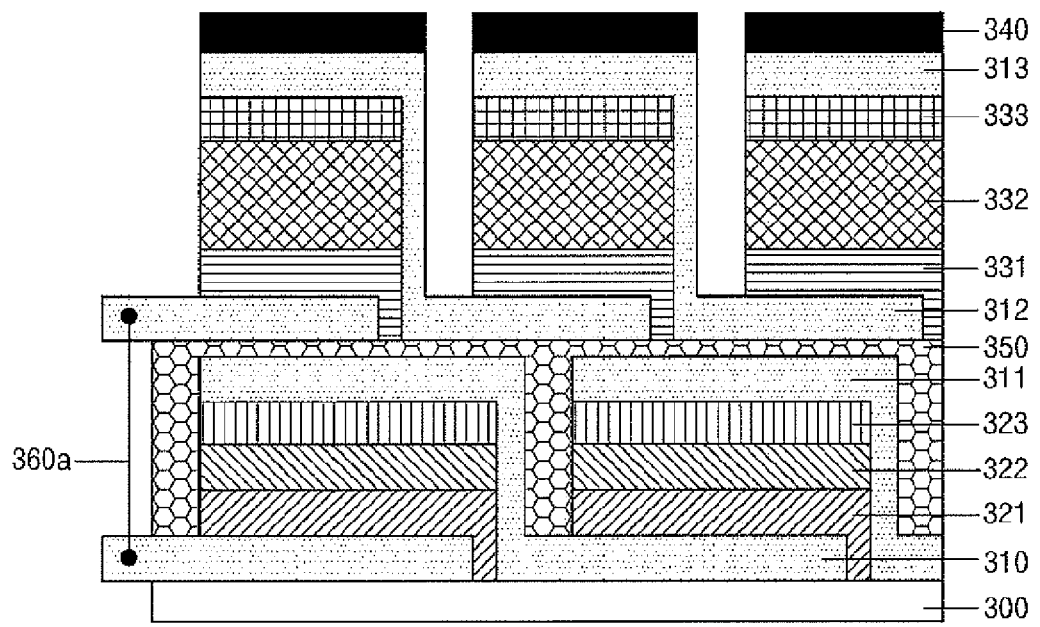
Figure 24:
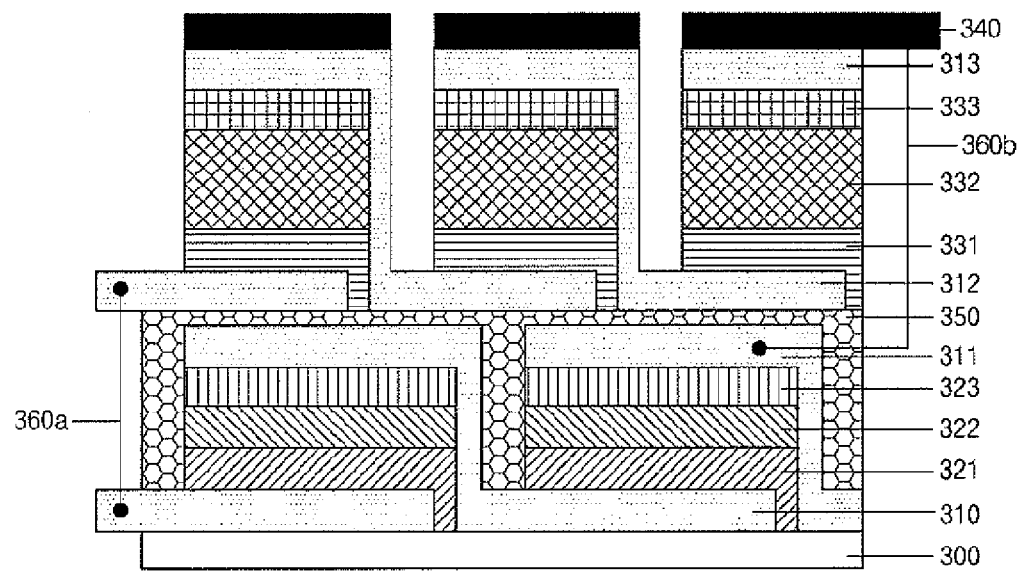

FIG. 7 is a graph illustrating the relationship between short-circuit current density-voltage for thin-film solar cell modules according to the preferred embodiment of the present invention and the thin-film solar cell module according to the preferred embodiment of the prior art and FIG. 8 is a graph illustrating the relationship between efficiency-voltage for the thin-film solar cell modules according to the preferred embodiment of the present invention and the thin-film solar cell module according to the preferred embodiment of the prior art.

The structure of the thin-film solar cell modules according to the prior art in FIG. 7 and FIG. 8 has the same structure as shown in FIG. 1. The solar cell according to the prior art shown in FIG. 3 is excluded from comparison objects because it has a structure that the voltages of the solar cell layer of the upper part and lower part are not combined together.

Referring to FIG. 1, the lower solar cell layer generally consists of an amorphous silicon (a-Si:H) solar cell layer and it is supposed that a stand-off voltage (Voc) is 0.90 V and the short-circuit current density (Jsc) is 8.0 mA/cm$^2$, and at that time, the efficiency is about 5.4%. Further, the upper solar cell layer generally consists of a microcrystalline silicon (uc-Si:H) solar cell layer, and it is supposed that Voc is 0.62V, Jsc is 20 mA/cm$^2$ and the efficiency is 9.3%

In a case where both the solar cell layers are connected in series by the conventional method as shown in FIG. 1, Voc is 1.52 V, Jsc is 8 mA/cm$^2$ and the efficiency is about 10.0%, these are indicated as a gray solid line in FIGS. 7 and 8. It has a result that the efficiency is not increased because of mismatching of the short-circuit current.

However, according to the preferred embodiment of the present invention, in a case where two unit cells of the first solar cell layer are connected in series, Voc is 1.80 V, Jsc is 4 mA/cm$^2$, and in a case where three unit cells of the second solar cell layer are connected in series, Voc is 1.86 V and Jsc is 6.7 mA/cm$^2$, and thus, the threshold voltages become nearly coincident with each other. Accordingly, in a case of parallel connection, Voc is 1.84 V and Jsc is 10.7 mA/cm$^2$, and the efficiency is 14.8% which results in an increase in the efficiency of about 4.8% compared with the efficiency of the conventional solar cell module. The short-circuit current density and efficiency of the present invention are indicated by a gray solid line in FIGS. 7 and 8.

FIG. 9 to FIG. 24 are sectional views of a stack structure of modules illustrating a method of manufacturing the thin-film solar cell in response to process steps according to the preferred embodiment of the present invention.

A manufacture method according to the preferred embodiment of the present invention comprises the steps of: forming a first solar cell layer; forming a second solar cell layer formed of semiconductor materials having band gap energy which are different from the first solar cell layer; and electrically connecting the first solar cell layer with the second solar cell layer in parallel, and further comprises processes of providing a transparent conductive layer at an upper part and a lower part of each solar cell layer and forming a back-side electrode layer at the upper part of the second solar cell layer.

To the structure wherein the first solar cell layer and the second solar cell layer may be consecutively stacked up and down, a process for forming insulating layers between both the solar cells is added.

The detailed process according to the preferred embodiment of the present invention may be divided into steps as follows:

(FIG. 9) The transparent conductive layer 310, which preferably comprises a transparent conductive oxide(TCO), is firstly stacked on a glass substrate 300.

The above substrate is not limited to the glass substrate.

(FIG. 10) The first transparent conductive layer 310 is patterned using a laser scribing process.

The process of patterning is not limited to the laser scribing method and methods, which could be easily conceived by those skilled in the art based on the well-known art, may be used.

In general, as methods of patterning, a laser scribing method, an optical scribing method, mechanical scribing method, etching method using plasma, wet-type etching methods, dry type etching methods, lift off method and wire mask method have been used.

(FIG. 11) A p-type amorphous silicon (a-Si:H) layer is stacked.

(FIG. 12) An i-type amorphous silicon (a-Si:H) layer is stacked.

(FIG. 13) An n type amorphous silicon (a Si:H) layer is stacked.

(FIG. 14) The unit cell is formed by using a laser scribing process.

(FIG. 15) A transparent conductive layer 311 is secondly stacked.

(FIG. 16) The first solar cell layer is patterned by using the laser scribing process. At this time, it is patterned except for a region, with which the first transparent conductive layer 310 and the second transparent conductive layer 311 are connected.

(FIG. 17) An insulating layer 350 and a third transparent conductive layer 312 are consecutively stacked.

(FIG. 18) The third transparent conductive layer is patterned using the laser scribing process. The line width is different from the width of the unit cell of the first solar cell layer as designed for matching of the threshold voltage.

(FIG. 19) An electrode connector 360a, which connects the transparent conductive layer 310 for the lower electrode of the first solar cell layer with the transparent conductive layer 312 for the lower electrode of the second solar cell layer, is formed at one part of unit cell. Materials of forming the electrode connector may be conductive materials such as metal.

(FIG. 20) Microcrystalline silicon (un-Si:H) p layer 331, i layer 332 and n layer 333 are consecutively stacked.

(FIG. 21) The microcrystalline silicon layer is patterned so that the unit cell of the second solar cell layer is formed using the laser scribing process. At this time, pattering is performed according to a pattern of the transparent conductive layer 312, which is thirdly stacked.

(FIG. 22) A transparent conductive layer 313 is fourthly stacked and a back-side metal electrode layer 340 is consecutively stacked thereon.

(FIG. 23) The second solar cell layer is patterned using the laser scribing process. At this time, it is patterned except a region between the unit cells, from which the third transparent conductive layer 312 and the fourth transparent conductive layer 313 are connected so that the unit cells of the second solar cell layer are connected in series.

(FIG. 24) An electrode connector 360b, which connects the transparent conductive layer 311 for the upper electrode of the first solar cell layer with the transparent conductive layer 313 for the upper electrode of the second solar cell layer, is formed at one side of unit cell of the second solar cell layer opposite to the electrode connector 360a. The electrode connector 360b may be connected to the back side electrode layer 340 instead of the transparent conductive layer 313 for the upper electrode of the second solar cell layer.

A pair of electrode connectors 360a, 360b may be separately connected as the above example embodiment, and simultaneously connected after all process is finished.

Figure 25:
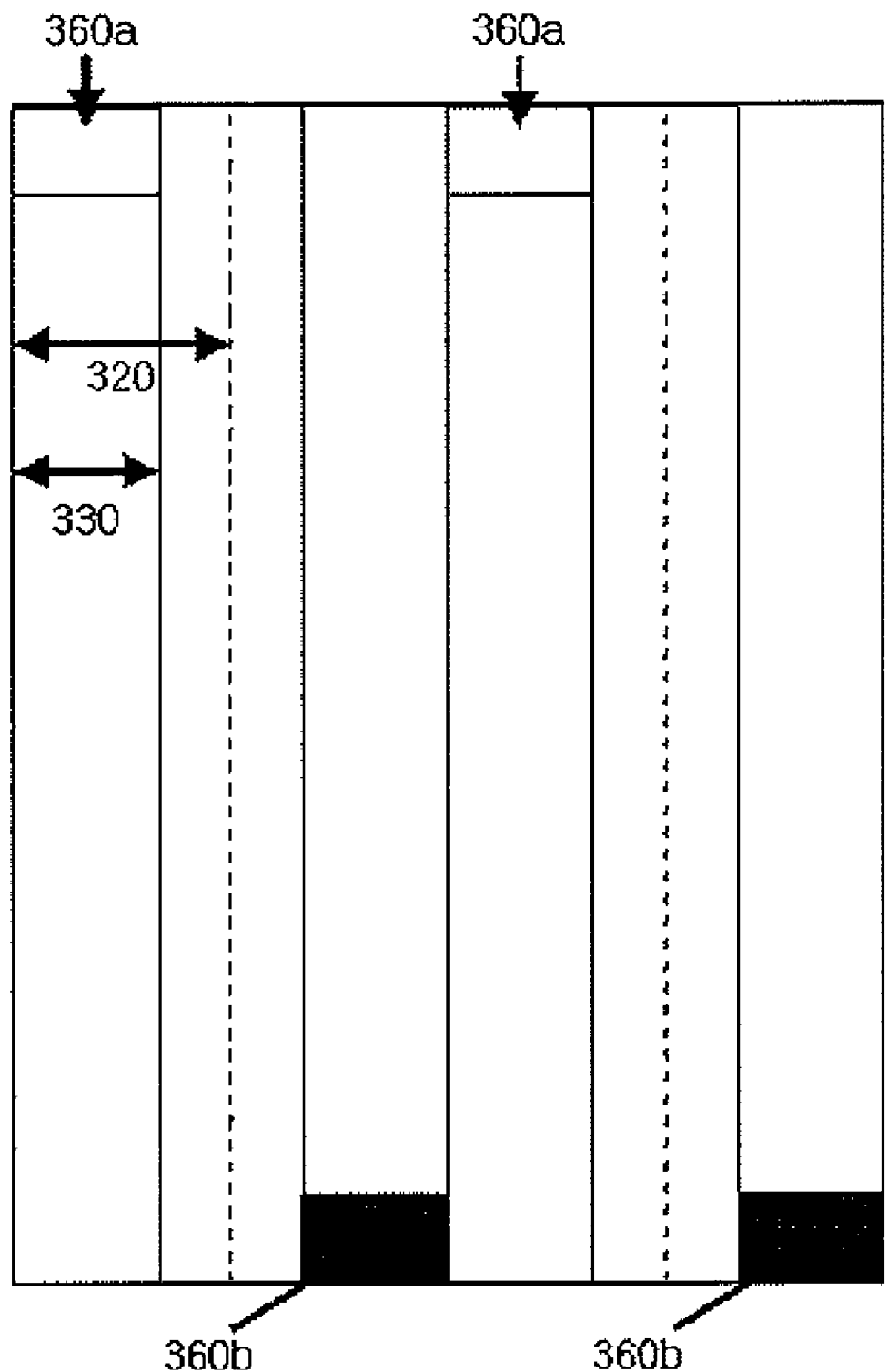
FIG. 25 is a top plan view illustrating the thin-film solar cell module according to the preferred embodiment of the present invention.

FIG. 25 is a top plan view illustrating the thin-film solar cell module according to the preferred embodiment of the present invention.

In the step of the above fabrication method, as a method of forming the electrode connectors of the first solar cell layer and the second solar cell layer, as shown in FIG. 25, upper electrodes of both the solar cell layers are connected with each other at one side of the module and lower electrodes of both the solar cell layers are connected with each other at the other side of the module.

It is not necessary that the upper electrode connection site is directly opposite to the lower electrode connection site and it is possible to connect the upper and lower electrodes at any site within the unit cells of the solar cell layer.

The present invention may be used for providing a solar cell having a thin-film solar cell structure, which is capable of increasing a photoelectric conversion efficiency and a stable reliability and may be utilized for a method of manufacturing the solar cell, which is capable of producing a large area solar cell through a relatively simple process and at low fabrication costs.

Further, the present invention provides a structure of the solar cell and a method of manufacturing the same, which are capable of having a high photoelectric conversion efficiency and producing solar cells having large area at low-costs, and accordingly, will contribute to protecting earth's environment by providing clean energy resources for the next generation and create great economic benefit by its application to public facilities, private facilities, munitions facilities and other various fields.

Although the present invention has been described in detail reference to its presently preferred embodiment, it will be understood by those skilled in the art that various modifications and equivalents can be made without departing from the spirit and scope of the present invention, as set forth in the appended claims.

What is claimed is:

1. A thin-film solar cell, comprising:
a substrate;
a first solar cell layer comprising a plurality of unit cells connected in series on the substrate, wherein each unit cell includes a photoelectric conversion layer;
a second solar cell layer comprising a plurality of unit cells connected in series on the first solar cell layer, wherein each unit cell includes a photoelectric conversion layer; and
an electrode connector, which electrically connects the first solar cell layer with the second solar cell layer in parallel,
wherein a number of the plurality of unit cells of the first solar cell layer is different than a number of the plurality of unit cells of the second solar cell layer, and
the number of the plurality of unit cells of the first solar cell layer and the number of the plurality of unit cells of the second solar cell layer are determined so that a threshold voltage of the first solar cell layer is matched with a threshold voltage of the second solar cell layer.

2. The thin-film solar cell of claim 1, wherein the second solar cell layer has a band gap energy, which is different from a band gap energy of the first solar cell layer.

3. The thin-film solar cell of claim 1, wherein the photoelectric conversion layers is any one selected from a group consisting of amorphous silicon, microcrystalline silicon, monocrystalline silicon, polycrystalline silicon, amorphous SiC, amorphous SiN, amorphous SiGe, amorphous SiSn, gallium arsenide (GaAs), aluminum gallium arsenide (AlGaAs), indium phosphorus (InP), gallium phosphorus (GaP), copper indium gallium selenide (CIGS), cadmium telluride (CdTe), cadmium sulfide, copper sulfide ($Cu_2S$), zinc telluride (ZnTe), Plumbum sulfide (PbS), copper indium diselenide ($CuInSe_2$, CIS), gallium antimonide (GaSb) and compounds thereof.

4. The thin-film solar cell of claim 1, wherein the first solar cell layer and the second solar cell layer are any one selected from an amorphous silicon solar cell layer and a microcrystalline silicon solar cell layer.

5. The thin-film solar cell of claim 4, wherein the amorphous silicon solar cell layer is formed such that a p-i-n type amorphous silicon layer is consecutively stacked or a p-n type amorphous silicon layer is consecutively stacked.

6. The thin-film solar cell of claim 4, wherein the microcrystalline silicon solar cell layer is formed such that a p-i-n type microcrystalline silicon layer is consecutively stacked or a p-n type microcrystalline silicon layer is consecutively stacked.

7. The thin-film solar cell of claim 1, further comprising a transparent conductive layer provided at an upper part and a lower part of the unit cells, respectively.

8. The thin-film solar cell of claim 7, wherein the unit cells are connected in series by connecting an upper transparent conductive layer of the unit cells with a lower transparent conductive layer of adjacent unit cells.

9. The thin-film solar cell of claim 7, further comprising at least one or more electrode connector configured of:
   a lower electrode connector, which connects the lower transparent conductive layer of each unit cell of the first solar cell layer with the lower transparent conductive layer of each unit cell of the second solar cell layer; and
   an upper electrode connector, which connects the upper transparent conductive layer of each unit cell of the first solar cell layer with the upper transparent conductive layer of each unit cell of the second solar cell layer.

10. The thin-film solar cell of claim 9, wherein the first solar cell layer and the second solar cell layer, which are connected by the upper and lower electrode connectors, have the same width as each other.

11. The thin-film solar cell of claim 9, wherein the upper electrode connector and the lower electrode connector are formed at the opposite side of cells, respectively.

12. The thin-film solar cell of claim 1, further comprising an insulating layer formed between the first solar cell layer and the second solar cell layer.

13. A method of manufacturing a thin-film solar cell, the method comprising:
   forming a first solar cell layer by forming a plurality of unit cells and connecting them in series on a substrate, wherein each unit cell includes a photoelectric conversion layer; and
   forming a second solar cell layer by forming a plurality of unit cells and connecting them in series on the first solar cell layer, wherein each unit cell includes a photoelectric conversion layer; and
   electrically connecting the first solar cell layer with the second solar cell layer in parallel,
   wherein a number of the plurality of unit cells of the first solar cell layer is different than a number of the plurality of unit cells of the second solar cell layer, and
   the number of the plurality of unit cells of the first solar cell layer and the number of the plurality of unit cells of the second solar cell layer are determined so that a threshold voltage of the first solar cell layer is matched with a threshold voltage of the second solar cell layer.

14. The method of manufacturing the thin-film solar cell of claim 13, wherein the second solar cell layer has a band gap energy, which is different from a band gap energy of the first solar cell layer.

15. The method of manufacturing the thin-film solar cell of claim 13, further comprising the step of forming transparent conductive layers at the upper part and lower part of the unit cells, respectively.

16. The method of manufacturing the thin-film solar cell of claim 15, wherein the unit cells are connected in series by connecting an upper transparent conductive layer of unit cells with a lower transparent conductive layer of adjacent unit cells.

17. The method of manufacturing the thin-film solar cell of claim 15, further comprising at least one or more electrode connector configured of:
   a lower electrode connector, which connects the lower transparent conductive layer of each unit cell of the first solar cell layer and the lower transparent conductive layer of each unit cell of the second solar cell layer; and
   an upper electrode connector, which connects the upper transparent conductive layer of each unit cell of the first solar cell layer and the upper transparent conductive layer of each unit cell of the second solar cell layer.

18. The method of manufacturing the thin-film solar cell of claim 17, wherein the first solar cell layer and the second solar cell layer, which are connected by the upper and lower electrode connector, have the same width as each other.

19. The method of manufacturing the thin-film solar cell of claim 17, wherein the upper electrode connector and the lower electrode connector are formed at the opposite side of the cells, respectively.

20. The method of manufacturing the thin-film solar cell of claim 13, wherein the unit cells is patterned by any one method selected from a laser scribing method, an optical scribing method, a mechanical scribing method, an etching method using plasma, a wet-type etching method, a dry-type etching method, a lift-off method and a wire mask method.

21. The method of manufacturing the thin-film solar cell of claim 13, further comprising the step of forming an insulating layer between the first solar cell layer and the second solar cell layer.

22. The method of manufacturing the thin-film solar cell of claim 13, wherein the first solar cell layer and the second solar cell layer is vertically stacked with an insulating layer therebetween.

23. The method of manufacturing the thin-film solar cell of claim 13, wherein the first solar cell layer is formed by consecutively stacking a p-i-n type amorphous silicon layer or a p-n type amorphous silicon layer, and the second solar cell layer is formed by consecutively stacking a p-i-n type microcrystalline silicon layer or a p-n type microcrystalline silicon layer.

* * * * *